United States Patent
Delmas

(10) Patent No.: US 11,610,773 B2
(45) Date of Patent: Mar. 21, 2023

(54) CONDENSER SYSTEM FOR HIGH PRESSURE PROCESSING SYSTEM

(71) Applicant: Applied Materials, Inc., Santa Clara, CA (US)

(72) Inventor: Jean Delmas, Santa Clara, CA (US)

(73) Assignee: Applied Materials, Inc., Santa Clara, CA (US)

(*) Notice: Subject to any disclaimer, the term of this patent is extended or adjusted under 35 U.S.C. 154(b) by 177 days.

(21) Appl. No.: 16/830,420

(22) Filed: Mar. 26, 2020

(65) Prior Publication Data

US 2020/0227254 A1 Jul. 16, 2020

Related U.S. Application Data

(62) Division of application No. 16/183,967, filed on Nov. 8, 2018, now Pat. No. 10,685,830.

(60) Provisional application No. 62/587,916, filed on Nov. 17, 2017.

(51) Int. Cl.
| | |
|---|---|
| *B08B 3/02* | (2006.01) |
| *H01L 21/02* | (2006.01) |
| *H01L 21/67* | (2006.01) |
| *F16T 1/38* | (2006.01) |
| *F22B 29/08* | (2006.01) |

(52) U.S. Cl.
CPC .......... *H01L 21/02101* (2013.01); *B08B 3/02* (2013.01); *F16T 1/38* (2013.01); *F22B 29/08* (2013.01); *H01L 21/67034* (2013.01)

(58) Field of Classification Search
CPC ......... H01L 21/02101; H01L 21/67034; B08B 3/02; F16T 1/38; F22B 29/08
See application file for complete search history.

(56) References Cited

U.S. PATENT DOCUMENTS

| | | | |
|---|---|---|---|
| 3,684,592 | A | 8/1972 | Chang et al. |
| 3,749,383 | A | 7/1973 | Voigt et al. |
| 3,758,316 | A | 9/1973 | Sowards, et al. |
| 4,409,260 | A | 10/1983 | Pastor et al. |
| 4,424,101 | A | 1/1984 | Nowicki |
| 4,524,587 | A | 6/1985 | Kantor |

(Continued)

FOREIGN PATENT DOCUMENTS

| | | |
|---|---|---|
| CN | 1280875 C | 10/2006 |
| CN | 101871043 A | 10/2010 |

(Continued)

OTHER PUBLICATIONS

International Search Report and Written Opinion from PCT/US2018/034036 dated Aug. 24, 2018.

(Continued)

*Primary Examiner* — Sharidan Carrillo

(74) *Attorney, Agent, or Firm* — Patterson + Sheridan, LLP

(57) ABSTRACT

Embodiments described herein relate to a high pressure processing system with a condenser and methods for utilizing the same. The processing system includes a process chamber, a boiler, a condenser, and one or more heat exchangers. The boiler generates a fluid, such as a vapor or supercritical fluid, and delivers the fluid to the process chamber where a substrate is processed. After processing the substrate, the system is depressurized and the fluid is delivered to the condenser where the fluid is condensed.

17 Claims, 1 Drawing Sheet

(56) References Cited

U.S. PATENT DOCUMENTS

| | | |
|---|---|---|
| 4,576,652 A | 3/1986 | Hovel et al. |
| 4,589,193 A | 5/1986 | Goth et al. |
| 4,879,259 A | 11/1989 | Reynolds et al. |
| 5,050,540 A | 9/1991 | Lindberg |
| 5,114,513 A | 5/1992 | Hosokawa et al. |
| 5,126,117 A | 6/1992 | Schumacher et al. |
| 5,149,378 A | 9/1992 | Ohmi et al. |
| 5,167,717 A | 12/1992 | Boitnott |
| 5,175,123 A | 12/1992 | Vasquez et al. |
| 5,300,320 A | 4/1994 | Barron et al. |
| 5,314,541 A | 5/1994 | Saito et al. |
| 5,319,212 A | 6/1994 | Tokoro |
| 5,366,905 A | 11/1994 | Mukai |
| 5,472,812 A | 12/1995 | Sekine |
| 5,578,132 A | 11/1996 | Yamaga et al. |
| 5,590,695 A | 1/1997 | Siegele et al. |
| 5,597,439 A | 1/1997 | Salzman |
| 5,620,524 A | 4/1997 | Fan et al. |
| 5,677,230 A | 10/1997 | Weitzel et al. |
| 5,747,383 A | 5/1998 | Chen et al. |
| 5,808,245 A | 9/1998 | Wiese et al. |
| 5,857,368 A | 1/1999 | Grunes et al. |
| 5,858,051 A | 1/1999 | Komiyama et al. |
| 5,877,087 A | 3/1999 | Mosely et al. |
| 5,879,756 A | 3/1999 | Fathi et al. |
| 5,880,041 A | 3/1999 | Ong |
| 5,886,864 A | 3/1999 | Dvorsky |
| 5,888,888 A | 3/1999 | Talwar et al. |
| 5,918,149 A | 6/1999 | Besser et al. |
| 5,940,985 A | 8/1999 | Kamikawa et al. |
| 6,071,810 A | 6/2000 | Wada et al. |
| 6,077,571 A | 6/2000 | Kaloyeros |
| 6,082,950 A | 7/2000 | Altwood et al. |
| 6,086,730 A | 7/2000 | Liu |
| 6,103,585 A | 8/2000 | Michaelis |
| 6,136,664 A | 10/2000 | Economikos et al. |
| 6,140,235 A | 10/2000 | Yao et al. |
| 6,150,286 A | 11/2000 | Sun et al. |
| 6,164,412 A | 12/2000 | Allman |
| 6,207,487 B1 | 3/2001 | Kim et al. |
| 6,242,368 B1 | 6/2001 | Holmer et al. |
| 6,242,808 B1 | 6/2001 | Shimizu et al. |
| 6,251,242 B1 | 6/2001 | Fu et al. |
| 6,251,751 B1 | 6/2001 | Chu et al. |
| 6,277,249 B1 | 8/2001 | Gopalraja et al. |
| 6,284,646 B1 | 9/2001 | Leem |
| 6,299,753 B1 | 10/2001 | Chao et al. |
| 6,305,314 B1 | 10/2001 | Sneh et al. |
| 6,319,766 B1 | 11/2001 | Bakli et al. |
| 6,319,847 B1 | 11/2001 | Ishikawa |
| 6,334,249 B2 | 1/2002 | Hsu |
| 6,334,266 B1 | 1/2002 | Moritz et al. |
| 6,335,240 B1 | 1/2002 | Kim et al. |
| 6,344,249 B1 | 2/2002 | Maruyama et al. |
| 6,344,419 B1 | 2/2002 | Forster et al. |
| 6,348,376 B2 | 2/2002 | Lim et al. |
| 6,355,558 B1 | 3/2002 | Dixit |
| 6,358,829 B2 | 3/2002 | Yoon et al. |
| 6,368,412 B1 | 4/2002 | Gomi |
| 6,372,598 B2 | 4/2002 | Kang et al. |
| 6,387,764 B1 | 5/2002 | Curtis et al. |
| 6,399,486 B1 | 6/2002 | Chen et al. |
| 6,399,491 B2 | 6/2002 | Jeon et al. |
| 6,416,822 B1 | 7/2002 | Chiang et al. |
| 6,428,859 B1 | 8/2002 | Chiang et al. |
| 6,442,980 B2 | 9/2002 | Preston et al. |
| 6,451,119 B2 | 9/2002 | Sneh et al. |
| 6,451,695 B2 | 9/2002 | Sneh |
| 6,458,701 B1 | 10/2002 | Chae et al. |
| 6,464,779 B1 | 10/2002 | Powell et al. |
| 6,468,490 B1 | 10/2002 | Shamouilian et al. |
| 6,468,924 B2 | 10/2002 | Lee et al. |
| 6,475,910 B1 | 11/2002 | Sneh |
| 6,478,872 B1 | 11/2002 | Chae et al. |
| 6,482,262 B1 | 11/2002 | Elers et al. |
| 6,482,733 B2 | 11/2002 | Raaijmakers et al. |
| 6,482,740 B2 | 11/2002 | Soininen et al. |
| 6,489,214 B2 | 12/2002 | Kim et al. |
| 6,500,603 B1 | 12/2002 | Shioda |
| 6,511,539 B1 | 1/2003 | Raaijmakers |
| 6,534,395 B2 | 3/2003 | Werkhoven et al. |
| 6,548,424 B2 | 4/2003 | Putkonen |
| 6,551,929 B1 | 4/2003 | Kori et al. |
| 6,569,501 B2 | 5/2003 | Chiang et al. |
| 6,583,497 B2 | 6/2003 | Xia et al. |
| 6,585,823 B1 | 7/2003 | Van Wijck |
| 6,599,572 B2 | 7/2003 | Saanila et al. |
| 6,599,819 B1 | 7/2003 | Goto |
| 6,607,976 B2 | 8/2003 | Chen et al. |
| 6,619,304 B2 | 9/2003 | Worm |
| 6,620,670 B2 | 9/2003 | Song et al. |
| 6,620,723 B1 | 9/2003 | Byun et al. |
| 6,620,956 B2 | 9/2003 | Chen et al. |
| 6,630,201 B2 | 10/2003 | Chiang et al. |
| 6,632,279 B1 | 10/2003 | Ritala et al. |
| 6,657,304 B1 | 12/2003 | Woo et al. |
| 6,660,660 B2 | 12/2003 | Haukka et al. |
| 6,686,271 B2 | 2/2004 | Raaijmakers et al. |
| 6,780,777 B2 | 8/2004 | Yun et al. |
| 6,797,336 B2 | 9/2004 | Garvey et al. |
| 6,825,115 B1 | 11/2004 | Xiang et al. |
| 6,841,432 B1 | 1/2005 | Takemura et al. |
| 6,849,122 B1 | 2/2005 | Fair |
| 6,867,130 B1 | 3/2005 | Karlsson et al. |
| 6,867,152 B1 | 3/2005 | Hausmann et al. |
| 6,889,627 B1 | 5/2005 | Hao |
| 6,897,118 B1 | 5/2005 | Poon et al. |
| 6,969,448 B1 | 11/2005 | Lau |
| 7,055,333 B2 | 6/2006 | Leitch et al. |
| 7,084,079 B2 | 8/2006 | Conti et al. |
| 7,105,061 B1 | 9/2006 | Shrinivasan et al. |
| 7,111,630 B2 | 9/2006 | Mizobata et al. |
| 7,114,517 B2 | 10/2006 | Sund et al. |
| 7,211,525 B1 | 5/2007 | Shanker et al. |
| 7,282,458 B2 | 10/2007 | Gates et al. |
| 7,361,231 B2 | 4/2008 | Fury et al. |
| 7,429,402 B2 | 9/2008 | Gandikota et al. |
| 7,432,200 B2 | 10/2008 | Chowdhury et al. |
| 7,460,760 B2 | 12/2008 | Cho et al. |
| 7,465,650 B2 | 12/2008 | Derderian |
| 7,491,658 B2 | 2/2009 | Nguyen et al. |
| 7,503,334 B1 | 3/2009 | Shrinivasan et al. |
| 7,521,089 B2 | 4/2009 | Hillman et al. |
| 7,521,378 B2 | 4/2009 | Fucsko et al. |
| 7,541,297 B2 | 6/2009 | Mallick et al. |
| 7,576,441 B2 | 8/2009 | Yin et al. |
| 7,629,227 B1 | 12/2009 | Wang et al. |
| 7,650,965 B2 | 1/2010 | Thayer et al. |
| 7,651,959 B2 | 1/2010 | Fukazawa et al. |
| 7,655,532 B1 | 2/2010 | Chen et al. |
| 7,691,442 B2 | 4/2010 | Gandikota et al. |
| 7,709,320 B2 | 5/2010 | Cheng |
| 7,759,749 B2 | 7/2010 | Tanikawa |
| 7,825,038 B2 | 11/2010 | Ingle et al. |
| 7,825,042 B2 | 11/2010 | Mandal |
| 7,867,914 B2 | 1/2011 | Xi et al. |
| 7,867,923 B2 | 1/2011 | Mallick et al. |
| 7,891,228 B2 | 2/2011 | Ding et al. |
| 7,910,165 B2 | 3/2011 | Ganguli et al. |
| 7,964,505 B2 | 6/2011 | Khandelwal et al. |
| 7,964,506 B1 | 6/2011 | Ponnuswamy et al. |
| 8,027,089 B2 | 9/2011 | Hayashi |
| 8,278,224 B1 | 10/2012 | Mui et al. |
| 8,306,026 B2 | 11/2012 | Anjum et al. |
| 8,318,584 B2 | 11/2012 | Li et al. |
| 8,349,085 B2 | 1/2013 | Tahara et al. |
| 8,449,942 B2 | 5/2013 | Li et al. |
| 8,455,368 B2 | 6/2013 | Chandler et al. |
| 8,466,073 B2 | 6/2013 | Wang et al. |
| 8,481,123 B2 | 7/2013 | Kim et al. |
| 8,536,065 B2 | 9/2013 | Seamons et al. |
| 8,557,712 B1 | 10/2013 | Antonelli et al. |
| 8,563,445 B2 | 10/2013 | Liang et al. |
| 8,585,873 B2 | 11/2013 | Ford et al. |

(56) References Cited

U.S. PATENT DOCUMENTS

| | | |
|---|---|---|
| 8,647,992 B2 | 2/2014 | Liang et al. |
| 8,648,253 B1 | 2/2014 | Woods et al. |
| 8,668,868 B2 | 3/2014 | Chiu et al. |
| 8,741,788 B2 | 6/2014 | Liang et al. |
| 8,871,656 B2 | 10/2014 | Mallick et al. |
| 8,906,761 B2 | 12/2014 | Kim et al. |
| 8,936,834 B2 | 1/2015 | Kim et al. |
| 9,121,515 B2 | 9/2015 | Yamamoto et al. |
| 9,153,442 B2 | 10/2015 | Wang et al. |
| 9,157,730 B2 | 10/2015 | Rajagopalan et al. |
| 9,190,321 B2 | 11/2015 | Cabral, Jr. et al. |
| 9,257,314 B1 | 2/2016 | Rivera et al. |
| 9,306,026 B2 | 4/2016 | Toriumi et al. |
| 9,330,939 B2 | 5/2016 | Zope et al. |
| 9,362,107 B2 | 6/2016 | Thadani et al. |
| 9,382,621 B2 | 7/2016 | Choi et al. |
| 9,423,313 B2 | 8/2016 | Douba et al. |
| 9,484,406 B1 | 11/2016 | Sun et al. |
| 9,502,307 B1 | 11/2016 | Bao et al. |
| 9,570,551 B1 | 2/2017 | Balakrishnan et al. |
| 9,583,655 B2 | 2/2017 | Cheng |
| 9,646,850 B2 | 5/2017 | Pethe |
| 9,679,810 B1 | 6/2017 | Nag et al. |
| 9,685,371 B2 | 6/2017 | Zope et al. |
| 9,695,503 B2 | 7/2017 | Stowell et al. |
| 9,741,626 B1 | 8/2017 | Cheng et al. |
| 9,777,378 B2 | 10/2017 | Nemani et al. |
| 10,049,927 B2 | 8/2018 | Mebarki et al. |
| 10,083,834 B2 | 9/2018 | Thompson et al. |
| 10,096,516 B1 | 10/2018 | Leschkies et al. |
| 10,179,941 B1 | 1/2019 | Khan et al. |
| 10,224,224 B2 | 3/2019 | Liang et al. |
| 10,234,630 B2 | 3/2019 | Meyer Timmerman Thijssen et al. |
| 10,269,571 B2 | 4/2019 | Wong et al. |
| 10,276,411 B2 | 4/2019 | Delmas et al. |
| 10,403,729 B2 | 9/2019 | Lee |
| 10,410,918 B2 | 9/2019 | Wu et al. |
| 10,529,585 B2 | 1/2020 | Manna et al. |
| 10,529,603 B2 | 1/2020 | Liang et al. |
| 10,566,188 B2 | 2/2020 | Clemons et al. |
| 10,622,214 B2 | 4/2020 | Wong et al. |
| 10,636,669 B2 | 4/2020 | Chen et al. |
| 10,636,677 B2 | 4/2020 | Delmas et al. |
| 10,636,704 B2 | 4/2020 | Mebarki et al. |
| 10,643,867 B2 | 5/2020 | Delmas et al. |
| 10,675,581 B2 | 6/2020 | Khan et al. |
| 10,685,830 B2 * | 6/2020 | Delmas ............... B08B 3/02 |
| 10,714,331 B2 | 7/2020 | Balseanu et al. |
| 10,720,341 B2 | 7/2020 | Liang et al. |
| 10,748,783 B2 | 8/2020 | Khan et al. |
| 10,790,183 B2 | 9/2020 | Sun et al. |
| 10,847,360 B2 | 11/2020 | Wong et al. |
| 10,854,483 B2 | 12/2020 | Schaller et al. |
| 10,916,433 B2 | 2/2021 | Ren et al. |
| 10,950,429 B2 | 3/2021 | Citla et al. |
| 10,957,533 B2 | 3/2021 | Jiang et al. |
| 11,018,032 B2 | 5/2021 | Delmas et al. |
| 11,101,174 B2 | 8/2021 | Jiang et al. |
| 2001/0016429 A1 | 8/2001 | Mak et al. |
| 2001/0029108 A1 | 10/2001 | Tometsuka |
| 2001/0041122 A1 | 11/2001 | Kroeker |
| 2001/0050096 A1 | 12/2001 | Costantini et al. |
| 2001/0055649 A1 | 12/2001 | Ogure et al. |
| 2002/0066535 A1 | 6/2002 | Brown et al. |
| 2002/0073922 A1 | 6/2002 | Frankel et al. |
| 2002/0098715 A1 | 7/2002 | Lane et al. |
| 2002/0122885 A1 | 9/2002 | Ahn |
| 2002/0134439 A1 | 9/2002 | Kawasaki et al. |
| 2002/0148492 A1 | 10/2002 | Yamagata et al. |
| 2002/0151128 A1 | 10/2002 | Lane et al. |
| 2002/0155714 A1 | 10/2002 | Suzuki |
| 2002/0192056 A1 | 12/2002 | Reimer et al. |
| 2002/0197806 A1 | 12/2002 | Furukawa et al. |
| 2003/0022487 A1 | 1/2003 | Yoon et al. |
| 2003/0030945 A1 | 2/2003 | Heinonen et al. |
| 2003/0049372 A1 | 3/2003 | Cook et al. |
| 2003/0053893 A1 | 3/2003 | Matsunaga et al. |
| 2003/0059538 A1 | 3/2003 | Chung et al. |
| 2003/0101938 A1 | 6/2003 | Ronsse et al. |
| 2003/0121887 A1 | 7/2003 | Garvey et al. |
| 2003/0129832 A1 | 7/2003 | Fujikawa |
| 2003/0148035 A1 | 8/2003 | Lingampalli |
| 2003/0148631 A1 | 8/2003 | Kuo et al. |
| 2003/0194615 A1 | 10/2003 | Krauth |
| 2003/0207593 A1 | 11/2003 | Derderian et al. |
| 2003/0232512 A1 | 12/2003 | Dickinson et al. |
| 2004/0025908 A1 | 2/2004 | Douglas et al. |
| 2004/0060519 A1 | 4/2004 | Beauchaine et al. |
| 2004/0074869 A1 | 4/2004 | Wang et al. |
| 2004/0097060 A1 | 5/2004 | San et al. |
| 2004/0112409 A1 | 6/2004 | Schilling |
| 2004/0180510 A1 | 9/2004 | Ranade |
| 2004/0184792 A1 | 9/2004 | Hamelin et al. |
| 2004/0219800 A1 | 11/2004 | Tognetti |
| 2004/0221877 A1 * | 11/2004 | Bergman ............... B08B 3/02 257/E21.228 |
| 2004/0248392 A1 | 12/2004 | Narwankar et al. |
| 2004/0255979 A1 | 12/2004 | Fury et al. |
| 2005/0003655 A1 | 1/2005 | Cathey et al. |
| 2005/0014365 A1 | 1/2005 | Moon et al. |
| 2005/0022737 A1 | 2/2005 | Shimizu et al. |
| 2005/0051194 A1 | 3/2005 | Sakashita et al. |
| 2005/0074956 A1 | 4/2005 | Autryve et al. |
| 2005/0082281 A1 | 4/2005 | Uemori et al. |
| 2005/0109392 A1 | 5/2005 | Hollars |
| 2005/0136684 A1 | 6/2005 | Mukai et al. |
| 2005/0161158 A1 | 7/2005 | Schumacher |
| 2005/0164445 A1 | 7/2005 | Lin et al. |
| 2005/0186765 A1 | 8/2005 | Ma et al. |
| 2005/0191828 A1 | 9/2005 | Al-Bayati et al. |
| 2005/0198971 A1 | 9/2005 | Leitch et al. |
| 2005/0205210 A1 | 9/2005 | Devine et al. |
| 2005/0227479 A1 | 10/2005 | Feng et al. |
| 2005/0250347 A1 | 11/2005 | Bailey et al. |
| 2005/0269291 A1 | 12/2005 | Kent |
| 2006/0003596 A1 | 1/2006 | Fucsko et al. |
| 2006/0035035 A1 | 2/2006 | Sakama |
| 2006/0079086 A1 | 4/2006 | Boit et al. |
| 2006/0091493 A1 | 5/2006 | Wu |
| 2006/0105107 A1 | 5/2006 | Lindeboom et al. |
| 2006/0105515 A1 | 5/2006 | Amos et al. |
| 2006/0105557 A1 | 5/2006 | Klee et al. |
| 2006/0110934 A1 | 5/2006 | Fukuchi |
| 2006/0124613 A1 | 6/2006 | Kumar et al. |
| 2006/0128150 A1 | 6/2006 | Gandikota et al. |
| 2006/0175012 A1 | 8/2006 | Lee |
| 2006/0207633 A1 | 9/2006 | Kim et al. |
| 2006/0226117 A1 | 10/2006 | Bertram et al. |
| 2006/0240187 A1 | 10/2006 | Weidman |
| 2006/0279025 A1 | 12/2006 | Heidari et al. |
| 2006/0290017 A1 | 12/2006 | Yanagisawa |
| 2007/0012402 A1 | 1/2007 | Sneh |
| 2007/0045753 A1 | 3/2007 | Pae et al. |
| 2007/0087533 A1 | 4/2007 | Nishikawa et al. |
| 2007/0095651 A1 | 5/2007 | Ye et al. |
| 2007/0111519 A1 | 5/2007 | Lubomirsky et al. |
| 2007/0116873 A1 | 5/2007 | Li et al. |
| 2007/0145416 A1 | 6/2007 | Ohta |
| 2007/0187386 A1 | 8/2007 | Kim et al. |
| 2007/0204797 A1 | 9/2007 | Fischer |
| 2007/0209931 A1 | 9/2007 | Miller |
| 2007/0212850 A1 | 9/2007 | Ingle et al. |
| 2007/0243317 A1 | 10/2007 | Du Bois et al. |
| 2007/0254471 A1 | 11/2007 | Kameyama et al. |
| 2007/0254477 A1 | 11/2007 | Muraoka et al. |
| 2007/0256559 A1 | 11/2007 | Chen et al. |
| 2008/0001196 A1 | 1/2008 | Cheng |
| 2008/0073691 A1 | 3/2008 | Konno et al. |
| 2008/0074658 A1 | 3/2008 | Davis et al. |
| 2008/0076230 A1 | 3/2008 | Cheng |
| 2008/0083109 A1 | 4/2008 | Shibata et al. |
| 2008/0085611 A1 | 4/2008 | Khandelwal et al. |
| 2008/0115726 A1 | 5/2008 | Ingle et al. |

(56) References Cited

U.S. PATENT DOCUMENTS

| | | |
|---|---|---|
| 2008/0121882 A1 | 5/2008 | Hwang et al. |
| 2008/0132050 A1 | 6/2008 | Lavoie |
| 2008/0210273 A1 | 9/2008 | Joe |
| 2008/0241384 A1 | 10/2008 | Jeong et al. |
| 2008/0251904 A1 | 10/2008 | Theuss et al. |
| 2008/0268635 A1 | 10/2008 | Yu et al. |
| 2008/0311711 A1 | 12/2008 | Hampp et al. |
| 2008/0315762 A1 | 12/2008 | Hamada et al. |
| 2009/0018688 A1 | 1/2009 | Chandler et al. |
| 2009/0029126 A1 | 1/2009 | Tanikawa |
| 2009/0035915 A1 | 2/2009 | Su |
| 2009/0035952 A1 | 2/2009 | Chua et al. |
| 2009/0053426 A1 | 2/2009 | Lu et al. |
| 2009/0053893 A1 | 2/2009 | Khandelwal et al. |
| 2009/0081884 A1 | 3/2009 | Yokota et al. |
| 2009/0087981 A1 | 4/2009 | Suzuki et al. |
| 2009/0110622 A1 | 4/2009 | Chiu et al. |
| 2009/0148965 A1 | 6/2009 | Kim et al. |
| 2009/0180847 A1 | 7/2009 | Guo et al. |
| 2009/0183992 A1 | 7/2009 | Fredenberg et al. |
| 2009/0186481 A1 | 7/2009 | Suzuki et al. |
| 2009/0233449 A1 | 9/2009 | Lebouitz et al. |
| 2009/0243126 A1 | 10/2009 | Washiya et al. |
| 2009/0246952 A1 | 10/2009 | Ishizaka et al. |
| 2009/0269507 A1 | 10/2009 | Yu et al. |
| 2009/0283735 A1 | 11/2009 | Li et al. |
| 2009/0298257 A1 | 12/2009 | Lee et al. |
| 2010/0006211 A1 | 1/2010 | Wolk et al. |
| 2010/0012292 A1 | 1/2010 | Yamazaki |
| 2010/0022068 A1 | 1/2010 | Chen et al. |
| 2010/0032838 A1 | 2/2010 | Kikuchi et al. |
| 2010/0072569 A1 | 3/2010 | Han et al. |
| 2010/0102417 A1 | 4/2010 | Ganguli et al. |
| 2010/0173470 A1 | 7/2010 | Lee et al. |
| 2010/0173495 A1 | 7/2010 | Thakur et al. |
| 2010/0196626 A1 | 8/2010 | Choi et al. |
| 2010/0203725 A1 | 8/2010 | Choi et al. |
| 2010/0248419 A1 | 9/2010 | Woodruff et al. |
| 2010/0273324 A1 | 10/2010 | Lin et al. |
| 2010/0297854 A1 | 11/2010 | Ramamurthy et al. |
| 2010/0304027 A1 | 12/2010 | Lee et al. |
| 2010/0320459 A1 | 12/2010 | Umeda et al. |
| 2010/0323517 A1 | 12/2010 | Baker-O'Neal et al. |
| 2010/0327422 A1 | 12/2010 | Lee et al. |
| 2011/0011737 A1 | 1/2011 | Wu et al. |
| 2011/0048524 A1 | 3/2011 | Nam et al. |
| 2011/0124192 A1 | 5/2011 | Ganguli et al. |
| 2011/0151677 A1 | 6/2011 | Wang et al. |
| 2011/0163449 A1 | 7/2011 | Kelly et al. |
| 2011/0165781 A1 | 7/2011 | Liang et al. |
| 2011/0174363 A1 | 7/2011 | Munteanu |
| 2011/0198736 A1 | 8/2011 | Shero et al. |
| 2011/0204518 A1 | 8/2011 | Arunachalam |
| 2011/0233778 A1 | 9/2011 | Lee et al. |
| 2011/0237019 A1 | 9/2011 | Horng et al. |
| 2011/0240464 A1 | 10/2011 | Rasheed et al. |
| 2011/0263091 A1 | 10/2011 | Yamazaki |
| 2011/0303147 A1 | 12/2011 | Tachibana et al. |
| 2011/0305836 A1 | 12/2011 | Murata et al. |
| 2012/0048304 A1 | 3/2012 | Kitajima et al. |
| 2012/0056173 A1 | 3/2012 | Pieralisi |
| 2012/0060868 A1 | 3/2012 | Gray |
| 2012/0100678 A1 | 4/2012 | Sako et al. |
| 2012/0112224 A1 | 5/2012 | Le Bellac et al. |
| 2012/0138146 A1 | 6/2012 | Furuhata et al. |
| 2012/0142192 A1 | 6/2012 | Li et al. |
| 2012/0142198 A1 | 6/2012 | Wang et al. |
| 2012/0152898 A1 | 6/2012 | Cho et al. |
| 2012/0153483 A1 | 6/2012 | Akolkar et al. |
| 2012/0175822 A1 | 7/2012 | Inamiya et al. |
| 2012/0252207 A1 | 10/2012 | Lei et al. |
| 2012/0252210 A1 | 10/2012 | Tohnoe |
| 2012/0258602 A1 | 10/2012 | Subramani et al. |
| 2012/0285492 A1 | 11/2012 | Lee et al. |
| 2012/0304485 A1 | 12/2012 | Hayashi et al. |
| 2012/0309190 A1 | 12/2012 | Kelly et al. |
| 2013/0068391 A1 | 3/2013 | Mazzocco et al. |
| 2013/0069174 A1 | 3/2013 | Chuang et al. |
| 2013/0194350 A1 | 8/2013 | Watanabe et al. |
| 2013/0233170 A1* | 9/2013 | Spiegelman ........... B01D 71/82 95/1 |
| 2013/0241037 A1 | 9/2013 | Jeong et al. |
| 2013/0256125 A1 | 10/2013 | Young et al. |
| 2013/0277760 A1 | 10/2013 | Lu et al. |
| 2013/0288485 A1 | 10/2013 | Liang et al. |
| 2013/0302916 A1 | 11/2013 | Kim et al. |
| 2013/0330042 A1 | 12/2013 | Nara et al. |
| 2013/0337171 A1 | 12/2013 | Sasagawa |
| 2014/0003892 A1 | 1/2014 | Yamamoto et al. |
| 2014/0023320 A1 | 1/2014 | Lee et al. |
| 2014/0034632 A1 | 2/2014 | Pan et al. |
| 2014/0045300 A1 | 2/2014 | Chen et al. |
| 2014/0051264 A1 | 2/2014 | Mallick et al. |
| 2014/0076494 A1 | 3/2014 | Miyashita et al. |
| 2014/0102877 A1 | 4/2014 | Yamazaki |
| 2014/0134827 A1 | 5/2014 | Swaminathan et al. |
| 2014/0138802 A1 | 5/2014 | Starostine et al. |
| 2014/0144462 A1 | 5/2014 | Verhaverbeke et al. |
| 2014/0159135 A1 | 6/2014 | Fujimoto et al. |
| 2014/0183743 A1 | 7/2014 | Matsumoto et al. |
| 2014/0213070 A1 | 7/2014 | Hong et al. |
| 2014/0231384 A1 | 8/2014 | Underwood et al. |
| 2014/0234583 A1 | 8/2014 | Ryu et al. |
| 2014/0235068 A1 | 8/2014 | Ashihara et al. |
| 2014/0239291 A1 | 8/2014 | Son et al. |
| 2014/0264237 A1 | 9/2014 | Chen et al. |
| 2014/0268080 A1 | 9/2014 | Beasley et al. |
| 2014/0273335 A1 | 9/2014 | Abushama |
| 2014/0284821 A1 | 9/2014 | Hubbard |
| 2014/0319129 A1 | 10/2014 | Ahmad |
| 2014/0319462 A1 | 10/2014 | Huang et al. |
| 2014/0322921 A1 | 10/2014 | Ahmad et al. |
| 2015/0000870 A1 | 1/2015 | Hosotani et al. |
| 2015/0021672 A1 | 1/2015 | Chuang et al. |
| 2015/0024592 A1 | 1/2015 | Chandrashekar et al. |
| 2015/0050807 A1 | 2/2015 | Wu et al. |
| 2015/0056819 A1 | 2/2015 | Wong et al. |
| 2015/0091009 A1 | 4/2015 | Yamazaki et al. |
| 2015/0093891 A1 | 4/2015 | Zope et al. |
| 2015/0099342 A1 | 4/2015 | Tsai et al. |
| 2015/0144999 A1 | 5/2015 | Ching et al. |
| 2015/0145002 A1 | 5/2015 | Lee et al. |
| 2015/0159272 A1 | 6/2015 | Yoon et al. |
| 2015/0179501 A1 | 6/2015 | Jhaveri et al. |
| 2015/0197455 A1 | 7/2015 | Pranov |
| 2015/0203961 A1 | 7/2015 | Ha et al. |
| 2015/0255581 A1 | 9/2015 | Lin et al. |
| 2015/0279635 A1 | 10/2015 | Subramani et al. |
| 2015/0292736 A1 | 10/2015 | Hirson et al. |
| 2015/0309073 A1 | 10/2015 | Mirkin et al. |
| 2015/0322286 A1 | 11/2015 | Cabrini et al. |
| 2015/0348824 A1 | 12/2015 | Kuenle et al. |
| 2015/0357195 A1 | 12/2015 | Lam et al. |
| 2015/0364348 A1 | 12/2015 | Park et al. |
| 2016/0027887 A1 | 1/2016 | Yuan et al. |
| 2016/0035600 A1 | 2/2016 | Rivera et al. |
| 2016/0053366 A1 | 2/2016 | Stowell et al. |
| 2016/0064209 A1 | 3/2016 | Lee et al. |
| 2016/0064482 A1 | 3/2016 | Hashemi et al. |
| 2016/0076149 A1 | 3/2016 | Yamazaki et al. |
| 2016/0086831 A1 | 3/2016 | Rivera et al. |
| 2016/0093726 A1 | 3/2016 | Ching et al. |
| 2016/0111272 A1 | 4/2016 | Girard et al. |
| 2016/0111337 A1 | 4/2016 | Hatcher et al. |
| 2016/0118260 A1 | 4/2016 | Mebarki et al. |
| 2016/0118391 A1 | 4/2016 | Zhao et al. |
| 2016/0126104 A1 | 5/2016 | Shaviv et al. |
| 2016/0163540 A1 | 6/2016 | Liao et al. |
| 2016/0181414 A1 | 6/2016 | Huang et al. |
| 2016/0186363 A1 | 6/2016 | Merzaghi et al. |
| 2016/0204027 A1 | 7/2016 | Lakshmanan et al. |
| 2016/0208414 A1 | 7/2016 | Odawara et al. |
| 2016/0260526 A1 | 9/2016 | Otto |
| 2016/0268127 A1 | 9/2016 | Yamazaki |

(56) References Cited

U.S. PATENT DOCUMENTS

| | | |
|---|---|---|
| 2016/0273758 A1 | 9/2016 | Fujimura |
| 2016/0274454 A1 | 9/2016 | Beasley et al. |
| 2016/0284882 A1 | 9/2016 | Jang |
| 2016/0308048 A1 | 10/2016 | Ching et al. |
| 2016/0314964 A1 | 10/2016 | Tang et al. |
| 2016/0329190 A1 | 11/2016 | Evans et al. |
| 2016/0329458 A1 | 11/2016 | Evans et al. |
| 2016/0334162 A1 | 11/2016 | Kim et al. |
| 2016/0336405 A1 | 11/2016 | Sun et al. |
| 2016/0336475 A1 | 11/2016 | Mackie et al. |
| 2016/0353522 A1 | 12/2016 | Rathi et al. |
| 2016/0355927 A1 | 12/2016 | Weaver et al. |
| 2016/0358809 A1 | 12/2016 | Brown et al. |
| 2016/0358815 A1 | 12/2016 | Yu et al. |
| 2016/0372319 A1 | 12/2016 | Zeng et al. |
| 2016/0377972 A1 | 12/2016 | Hofmann et al. |
| 2016/0379853 A1 | 12/2016 | Schaller et al. |
| 2016/0379854 A1 | 12/2016 | Vopat et al. |
| 2017/0005188 A1 | 1/2017 | Cheng et al. |
| 2017/0005204 A1 | 1/2017 | Hosoba et al. |
| 2017/0011932 A1 | 1/2017 | Pethe et al. |
| 2017/0053784 A1 | 2/2017 | Subramani et al. |
| 2017/0053946 A1 | 2/2017 | Matsuzaki et al. |
| 2017/0084487 A1 | 3/2017 | Chebiam et al. |
| 2017/0104062 A1 | 4/2017 | Bi et al. |
| 2017/0110616 A1 | 4/2017 | Dissanayake et al. |
| 2017/0117379 A1 | 4/2017 | Chen et al. |
| 2017/0140996 A1 | 5/2017 | Lin et al. |
| 2017/0160012 A1 | 6/2017 | Kobayashi et al. |
| 2017/0162413 A1 | 6/2017 | Rebstock |
| 2017/0194430 A1 | 7/2017 | Wood et al. |
| 2017/0200642 A1 | 7/2017 | Shaviv |
| 2017/0253968 A1 | 9/2017 | Yahata |
| 2017/0263702 A1 | 9/2017 | Chan et al. |
| 2017/0263773 A1 | 9/2017 | Yamazaki |
| 2017/0287842 A1 | 10/2017 | Fu et al. |
| 2017/0301767 A1 | 10/2017 | Niimi et al. |
| 2017/0314125 A1 | 11/2017 | Fenwick et al. |
| 2017/0317109 A1 | 11/2017 | Wang et al. |
| 2017/0358483 A1 | 12/2017 | Roy et al. |
| 2018/0003567 A1 | 1/2018 | Petry et al. |
| 2018/0019249 A1 | 1/2018 | Zhang et al. |
| 2018/0023192 A1 | 1/2018 | Chandra et al. |
| 2018/0033615 A1 | 2/2018 | Tjandra |
| 2018/0051368 A1 | 2/2018 | Liu et al. |
| 2018/0053725 A1 | 2/2018 | Edelstein et al. |
| 2018/0068890 A1 | 3/2018 | Zope et al. |
| 2018/0087418 A1 | 3/2018 | Cadigan et al. |
| 2018/0096847 A1 | 4/2018 | Thompson et al. |
| 2018/0096874 A1 | 4/2018 | Schaller et al. |
| 2018/0182856 A1 | 6/2018 | Lee |
| 2018/0209037 A1 | 7/2018 | Citla et al. |
| 2018/0240682 A1 | 8/2018 | Lai et al. |
| 2018/0258533 A1 | 9/2018 | Liang et al. |
| 2018/0261480 A1 | 9/2018 | Liang et al. |
| 2018/0286674 A1 | 10/2018 | Manna et al. |
| 2018/0308669 A1 | 10/2018 | Bokka et al. |
| 2018/0315626 A1 | 11/2018 | Franklin |
| 2018/0323093 A1 | 11/2018 | Zhang et al. |
| 2018/0337027 A1 | 11/2018 | L'Heureux et al. |
| 2018/0342384 A1 | 11/2018 | Wong et al. |
| 2018/0342396 A1 | 11/2018 | Wong et al. |
| 2018/0350563 A1 | 12/2018 | Manna et al. |
| 2018/0366328 A1 | 12/2018 | Ren et al. |
| 2019/0019708 A1 | 1/2019 | Weaver et al. |
| 2019/0057879 A1 | 2/2019 | Delmas et al. |
| 2019/0119769 A1 | 4/2019 | Khan et al. |
| 2019/0139793 A1 | 5/2019 | Delmas et al. |
| 2019/0148178 A1 | 5/2019 | Liang et al. |
| 2019/0148186 A1 | 5/2019 | Schaller et al. |
| 2019/0157074 A1 | 5/2019 | Delmas |
| 2019/0170591 A1 | 6/2019 | Petry et al. |
| 2019/0198367 A1 | 6/2019 | Liang et al. |
| 2019/0198368 A1 | 6/2019 | Weaver et al. |
| 2019/0228982 A1 | 7/2019 | Chen et al. |
| 2019/0229004 A1 | 7/2019 | Schaller et al. |
| 2019/0237345 A1 | 8/2019 | Delmas et al. |
| 2019/0258153 A1 | 8/2019 | Nemani et al. |
| 2019/0259625 A1 | 8/2019 | Nemani et al. |
| 2019/0259638 A1 | 8/2019 | Schaller et al. |
| 2019/0279879 A1 | 9/2019 | Singh et al. |
| 2019/0311896 A1 | 10/2019 | Balseanu et al. |
| 2019/0326138 A1 | 10/2019 | Forderhase et al. |
| 2019/0360100 A1 | 11/2019 | Nguyen et al. |
| 2019/0360633 A1 | 11/2019 | Schaller et al. |
| 2019/0368035 A1 | 12/2019 | Malik et al. |
| 2019/0371650 A1 | 12/2019 | Sun et al. |
| 2019/0375105 A1 | 12/2019 | Weaver et al. |
| 2020/0035509 A1 | 1/2020 | Khan et al. |
| 2020/0035513 A1 | 1/2020 | Khan et al. |
| 2020/0075392 A1 | 3/2020 | Brown et al. |
| 2020/0098574 A1 | 3/2020 | Wong et al. |
| 2021/0167235 A1 | 6/2021 | Li et al. |

FOREIGN PATENT DOCUMENTS

| | | |
|---|---|---|
| CN | 102386052 A | 3/2012 |
| CN | 102856234 A | 1/2013 |
| CN | 104047676 A | 9/2014 |
| CN | 104089491 A | 10/2014 |
| EP | 0516344 A1 | 12/1992 |
| EP | 0670590 A2 | 9/1995 |
| EP | 1069213 A2 | 1/2001 |
| EP | 1107288 A2 | 6/2001 |
| EP | 0840365 A3 | 10/2003 |
| JP | 63-004616 | 1/1988 |
| JP | S6367721 A | 3/1988 |
| JP | H1218018 A | 8/1989 |
| JP | H04355922 A | 12/1992 |
| JP | H0521347 A | 1/1993 |
| JP | 06-283496 | 10/1994 |
| JP | H07048489 B2 | 5/1995 |
| JP | H07158767 A | 6/1995 |
| JP | H08195493 A | 7/1996 |
| JP | H09048690 A | 2/1997 |
| JP | H9296267 A | 11/1997 |
| JP | H10214880 A | 8/1998 |
| JP | H10335657 A | 12/1998 |
| JP | H11209872 A | 8/1999 |
| JP | H11-354515 A | 12/1999 |
| JP | 2000221799 A | 8/2000 |
| JP | 2000357699 A | 12/2000 |
| JP | 2001053066 A | 2/2001 |
| JP | 2001110729 A | 4/2001 |
| JP | 2001274161 A | 10/2001 |
| JP | 2003-51474 A | 2/2003 |
| JP | 2003-151896 A | 5/2003 |
| JP | 2003166065 A | 6/2003 |
| JP | 2003188387 A | 7/2003 |
| JP | 2004-127958 A | 4/2004 |
| JP | 2005-064269 A | 3/2005 |
| JP | 2005-79528 A | 3/2005 |
| JP | 2005530343 A | 10/2005 |
| JP | 2005-333015 A | 12/2005 |
| JP | 2006526125 A | 11/2006 |
| JP | 2007242791 A | 9/2007 |
| JP | 2008-73611 A | 4/2008 |
| JP | 2008118118 A | 5/2008 |
| JP | 2008153635 A | 7/2008 |
| JP | 2009-129927 A | 6/2009 |
| JP | 2009-262016 A | 11/2009 |
| JP | 2009-539231 A | 11/2009 |
| JP | 201080949 A | 4/2010 |
| JP | 2010168607 A | 8/2010 |
| JP | 2010-205854 A | 9/2010 |
| JP | 2011-017455 A | 1/2011 |
| JP | 2011-29394 A | 2/2011 |
| JP | 2011258943 A | 12/2011 |
| JP | 2012-503883 A | 2/2012 |
| JP | 2012-202570 A | 10/2012 |
| JP | 2012-204656 A | 10/2012 |
| JP | 2013-105777 A | 5/2013 |
| JP | 2013516788 A | 5/2013 |
| JP | 2013-179244 A | 9/2013 |

(56) References Cited

FOREIGN PATENT DOCUMENTS

| | | |
|---|---|---|
| JP | 2013-251550 A | 12/2013 |
| JP | 2014019912 A | 2/2014 |
| JP | 2014103351 A | 6/2014 |
| JP | 2015067884 A | 4/2015 |
| JP | 2015086459 A | 5/2015 |
| JP | 2015115394 A | 6/2015 |
| JP | 2015-233157 A | 12/2015 |
| KR | 19980063671 A | 10/1998 |
| KR | 20010046843 A | 6/2001 |
| KR | 20030052162 A | 6/2003 |
| KR | 100422433 B1 | 7/2004 |
| KR | 10-20040068969 A | 8/2004 |
| KR | 20050121750 A | 12/2005 |
| KR | 100684910 B1 | 2/2007 |
| KR | 20070075383 A | 7/2007 |
| KR | 20090011463 A | 2/2009 |
| KR | 1020090040867 A | 4/2009 |
| KR | 10-2009-0064279 A | 6/2009 |
| KR | 10-2010-00035000 A | 4/2010 |
| KR | 20110136532 A | 12/2011 |
| KR | 10-2013-0025138 A | 3/2013 |
| KR | 101287035 B1 | 7/2013 |
| KR | 101305904 B1 | 9/2013 |
| KR | 20140003776 A | 1/2014 |
| KR | 20140104112 A | 8/2014 |
| KR | 101438291 B1 | 9/2014 |
| KR | 20140135744 A | 11/2014 |
| KR | 20150006587 A | 1/2015 |
| KR | 20150122432 A | 11/2015 |
| KR | 20160044004 A | 4/2016 |
| KR | 20160061437 A | 5/2016 |
| TW | 200529284 A | 9/2005 |
| TW | 200721316 A | 6/2007 |
| TW | 201507174 A | 2/2015 |
| TW | 201608672 A | 3/2016 |
| TW | 201708597 A | 3/2017 |
| WO | 2000/51938 A1 | 9/2000 |
| WO | 03023827 A1 | 3/2003 |
| WO | 2004102055 A1 | 11/2004 |
| WO | 2005057663 A2 | 6/2005 |
| WO | 2008047886 A1 | 4/2008 |
| WO | 2008/089178 A2 | 7/2008 |
| WO | 2010115128 A3 | 1/2011 |
| WO | 2011002058 A1 | 1/2011 |
| WO | 2011/103062 A2 | 8/2011 |
| WO | 2012/133583 A1 | 10/2012 |
| WO | 2014115600 A1 | 7/2014 |
| WO | 2015195081 A1 | 12/2015 |
| WO | 2016/018593 A1 | 2/2016 |
| WO | 2016018593 A1 | 2/2016 |
| WO | 2016065219 A1 | 4/2016 |
| WO | 2016111833 A1 | 7/2016 |
| WO | 2018187546 A1 | 10/2018 |

OTHER PUBLICATIONS

International Search Report and Written Opinion dated Aug. 24, 2018 for Application No. PCT/US2018/034284.
International Search Report, Application No. PCT/US2018/028258 dated Aug. 9, 2018.
International Search Report and Written Opinion for PCT/US2018/035210 dated Aug. 24, 2018.
International Search Report and Written Opinion for PCT/US2018/037539 dated Oct. 5, 2018.
International Search Report and Written Opinion for PCT/US2018/038822 dated Oct. 26, 2018.
Chen, Yang et al., "Analysis of Supercritical Carbon Dioxide Heat Exchangers in Cooling Process", International Refrigeration and Air Conditioning Conference at Purdue, Jul. 17-20, 2006, pp. 1-8.
Shimoyama, Takehiro et al., "Porous Aluminum for Heat Exchanger", Hitachi Chemical, pp. 19-20.
Kato, T. et al., "Heat Transfer Characteristics of a Plate-Fin Type Supercritical/Liquid Helium Heat Exchanger", ICEC 14 Proceedings Supplement, 1992, pp. 260-263.
International Search Report and Written Opinion for PCT/US2018/043160 dated Jan. 31, 2019.
International Search Report and Written Opinion dated Jan. 31, 2019 for Application No. PCT/US2018/042760.
International Search Report and Written Opinion for PCT/US2018/059643 dated Feb. 26, 2019.
International Search Report and Written Opinion from PCT/US2019/012161 dated Apr. 30, 2019.
Taiwan Office Action dated Jun. 11, 2019 for Application No. 107138905.
International Search Report and Written Opinion for PCT/US2019/023431 dated Jul. 5, 2019.
International Search Report and Written Opinion for PCT/US2018/021715 dated Jun. 22, 2018.
International Search Report and Written Opinion for International Application No. PCT/US2019/029602 dated Aug. 14, 2019.
Office Action for Japanese Application No. 2018-546484 dated Oct. 8, 2019.
International Search Report and Written Opinion for International Application No. PCT/US2019/040195 dated Oct. 25, 2019.
Taiwan Office Action dated Nov. 19, 2019 for Application No. 108103415.
Office Action for Japanese Application No. 2018-517285 dated Oct. 23, 2019.
Office Action for Taiwan Patent Application No. 108111501 dated Nov. 14, 2019.
International Search Report and Written Opinion for PCT/US2018/050464 dated Jan. 4, 2019.
International Search Report and Written Opinion for PCT/US2019/056447 dated Feb. 7, 2020.
KR Office Action dated Feb. 4, 2020 for Application No. 10-2018-0133399.
Taiwan Office Action dated Feb. 21, 2020 for Application No. 108138212.
International Search Report and Written Opinion for International Application No. PCT/US2019/059659 dated Feb. 26, 2020.
Office Action from Taiwan Patent Application No. 108104585 dated Jan. 30, 2020, with concise statement of relevance.
Pedestal definition from Dictionary.com, printed on Feb. 10, 2020 (year 2020).
TW Application No. 107121254, Office Action dated May 4, 2020.
Taiwan Office Action dated Oct. 12, 2020 for Application No. 108140559.
Office Action for Japanese Application No. 2019-548976 dated Oct. 20, 2020.
European International Search Report issued to 1864622.9 dated Nov. 20, 2020.
Office Action for Korean Application No. 10-2019-7029776 dated Jan. 18, 2021.
International Search Report and Written Opinion dated Jan. 31, 2019 for Application No. PCT/US2018/043160.
Taiwan Office Action dated May 4, 2020 for Application No. 107121254.
Japanese Office Action dated Feb. 16, 2021 for Application No. 2019-564964.
Extended European International Search Report issued to 18831823.2 dated Mar. 19, 2021.
Office Action for Japanese Patent Application No. 2020-500629 dated Jun. 8, 2021.
Extended European Search Report for EP Application No. 18876650.5 dated Jul. 19, 2021.
Extended European Search Report for EP Application No. 18806169.1 dated Jul. 19, 2021.
Office Action for Korean Application No. 10-2020-7004396 dated Apr. 5, 2021.
Japanese Office Action dated Apr. 20, 2021 for Application No. JP 2020-508603.
Office Action for Japanese Patent Application No. 2019-548976 dated May 25, 2021.
Chen, Yang el al., "Analysis of Supercritical Carbon Dioxide Heal Exchangers in Cooling Process", International Refrigeration and Air Conditioning Conference at Purdue, Jul. 17-20, 2006, pp. 1-8.

(56) References Cited

OTHER PUBLICATIONS

Kato, T. el al., "Heat Transfer Characteristics of a Plate-Fin Type Supercriticauliquid Helium Heat Exchanger", ICEC 14 Proceedings Supplement, 1992, pp. 260-263.

F-ee, Ho-Saeng el al., "The cooling heal transfer characteristics of the supercritical C02 in mico-fin tube", Springer, Oct. 2, 2012, pp. 173-184.

International Search Report and Written Opinion for PCT/US2019/014759 dated May 14, 2019.

International Search Report and Written Opinion for PCT/US2019/015332 dated May 15, 2019.

International Search Report and Written Opinion for PCT/US2018/059676 dated May 23, 2019.

Haskel Pressure on Demand, Pneumatic and Hydraulic Driven Gas Boosters, Apr. 30, 2016, 36 pp.

Taiwan Office Action dated Jul. 3, 2019 for Application No. 107136181.

International Search Report and Written Opinion dated Nov. 30, 2018 for Application No. PCT/US2018/041688.

Korean Office Action dated Jul. 16, 2021 for Application No. 10-2020-7007956.

Office Action for Japanese Patent Application No. 2020-543976 dated Jul. 13, 2021.

Taiwan Office Action dated Jul. 28, 2021 for Application No. 107108016.

Notice of Allowance for U.S. Appl. No. 16/183,967 dated Mar. 4, 2020.

International Search Report and Written Opinion for International Application No. PCT/US2019/032609 dated Sep. 11, 2019.

Lin, Kevin L. et al.—"Nickel silicide for interconnects", 2015 IEEE International Interconnect Technology Conference and 2015 IEEE Materials for Advanced Metallization Conference (IITC/MAM), IEEE, (XP032808874), May 18, 2015, pp. 169-172.

EPO Extended European Search Report dated Aug. 9, 2019, for European Patent Application No. 19166775.7.

Japanese Office Action dated Mar. 17, 2020, for Japanese Patent Application No. 2019-073230.

Taiwan Office Action dated Mar. 31, 2020, for Taiwan Patent Application No. 108111883.

Korean Office Action dated Aug. 4, 2020, for Korean Patent Application No. 10-2019-0040236.

Japanese Office Action dated Nov. 10, 2020, for Japanese Patent Application No. 2019-073230.

T. Miyake et al., "Effects of atomic hydrogen on Cu reflow process", AIP Conferenec Proceedings 418, 419 (1998).

International Search Report and Written Opinion dated Aug. 24, 2017 for Application No. PCT/US2017/033862.

Taiwan Office Action for Application No. 106119184 dated Mar. 6, 2019.

Japanese Office Action for Application No. 2018-564195 dated Nov. 19, 2019.

PCT Notification of Transmittal of the International Search Report and the Written Opinion of the International Searching Authority for International Application No. PCT/US2019/061995; dated Mar. 9, 2020; 13 total pages.

International Search Report PCT/2020/046396 Dated Nov. 26, 2020 consists of 12 pages.

International Search Report and Written Opinion for PCT/US2021/014991 dated May 17, 2021.

Korean Office Action dated Aug. 26, 2021, for Korean Patent Application No. 10-2020-4016526.

\* cited by examiner

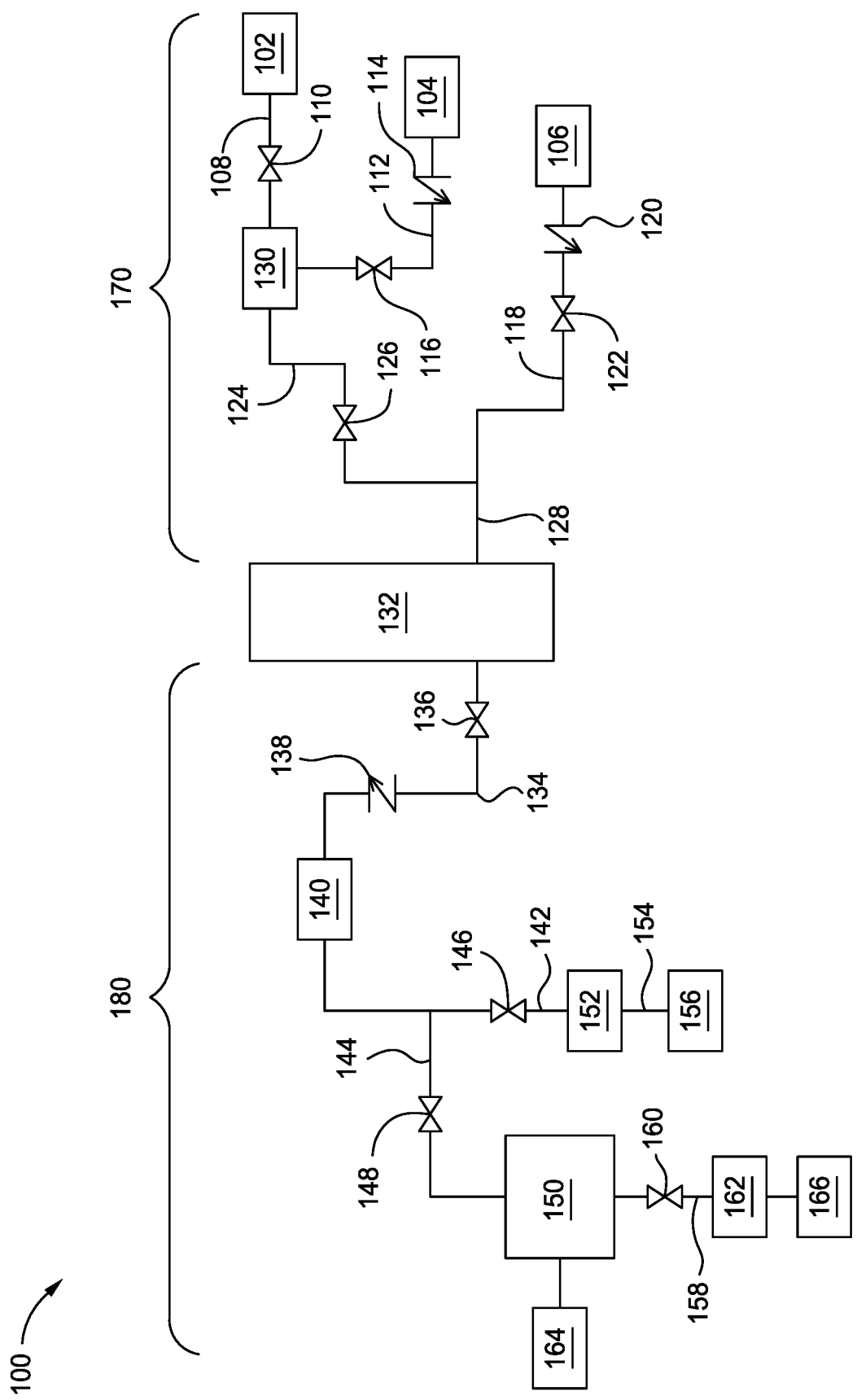

CONDENSER SYSTEM FOR HIGH PRESSURE PROCESSING SYSTEM

CROSS-REFERENCE TO RELATED APPLICATIONS

This application is a divisional of and claims benefit of U.S. patent application Ser. No. 16/183,967, filed Nov. 8, 2018, which claims benefit of U.S. Provisional Patent Application No. 62/587,916, filed Nov. 17, 2017, each of which are incorporated by reference in their entirety.

BACKGROUND

Field

Embodiments of the present disclosure generally relate to a substrate processing apparatus. More specifically, embodiments described herein relate to a condenser system for a high pressure processing system.

Description of the Related Art

Conventional substrate processing systems often operate at reduced pressures during processing operations. Recent developments in certain processing technology, such as substrate cleaning, utilize high pressure environments compatible with steam or supercritical fluids. However, conventional apparatus are not equipped to accommodate the unique pressure regimes associated with supercritical fluid processing. Moreover, conventional apparatus cannot easily be retrofitted to accommodate high pressure operating environments without the unnecessary risk of catastrophic apparatus failure.

Thus, what is needed in the art is a condenser system for a high pressure processing system.

SUMMARY

In one embodiment, a substrate process system is provided. The system includes a process chamber, a boiler in fluid communication with the process chamber via a first conduit, and a first valve disposed on the first conduit between the boiler and the process chamber. A condenser is in fluid communication with the process chamber via a second conduit and a second valve is disposed on the second conduit between the condenser and the process chamber. A heat exchanger is in fluid communication with the condenser via a third conduit and a third valve is disposed on the third conduit between the condenser and the heat exchanger.

In another embodiment, a substrate processing system is provided. The system includes a process chamber, a boiler in fluid communication with the process chamber via a first conduit, and a first valve disposed on the first conduit between the boiler and the process chamber. A condenser is in fluid communication with the process chamber and a second valve is disposed on the second conduit between the condenser and the process chamber. A first heat exchanger is disposed on the second conduit between the process chamber and the condenser and a fluid collection unit is in fluid communication with the condenser via a third conduit. A second heat exchanger is disposed on the third conduit between the condenser and the fluid collection unit and a third valve is disposed on the third conduit between the condenser and the second heat exchanger.

In yet another embodiment, a substrate process method is provided. The method includes heating conduits extending from a process chamber and heating a boiler in fluid communication with the process chamber. Valves disposed on conduits located upstream from the process chamber are closed and valves disposed on conduits located downstream from the process chamber are opened. A substrate is positioned in the process chamber, the process chamber is heated, the valves disposed on conduits located downstream from the process chamber are closed, and the valves disposed on conduits located upstream from the process chamber are opened to enable a fluid generated by the boiler to pressurize the process chamber. The valves disposed on conduits locate downstream from the process chamber are opened and the fluid from the process chamber is flowed to a condenser.

BRIEF DESCRIPTION OF THE DRAWINGS

So that the manner in which the above recited features of the present disclosure can be understood in detail, a more particular description of the disclosure, briefly summarized above, may be had by reference to embodiments, some of which are illustrated in the appended drawings. It is to be noted, however, that the appended drawings illustrate only exemplary embodiments and are therefore not to be considered limiting of its scope, and may admit to other equally effective embodiments.

FIG. 1 is a schematic illustration of a high pressure processing system with a condenser according to an embodiment described herein.

To facilitate understanding, identical reference numerals have been used, where possible, to designate identical elements that are common to the figures. It is contemplated that elements and features of one embodiment may be beneficially incorporated in other embodiments without further recitation.

DETAILED DESCRIPTION

Embodiments described herein relate to a high pressure processing system with a condenser and methods for utilizing the same. The processing system includes a process chamber, a boiler, a condenser, and one or more heat exchangers. The boiler generates a fluid, such as a vapor or supercritical fluid, and delivers the fluid to the process chamber where a substrate is processed. After processing the substrate, the system is depressurized and the fluid is delivered to the condenser where the fluid is condensed.

FIG. 1 is a schematic illustration of a high pressure processing system 100 with a condenser 150 according to an embodiment described herein. The system 100 includes a process chamber 132, a boiler 130, one or more heat exchangers 140, 152, 162, and the condenser 150. The boiler 130 is disposed in an upstream region 170 from the process chamber 132 and the heat exchangers 140, 152, 162 and condenser 150 are disposed in a downstream region 180 from the process chamber 132.

The system 100 also includes a plurality of fluid sources 102, 104, 106. In one embodiment, the fluid source 102 is a process liquid source, for example, a water source; the fluid source 104 is a process gas source, for example, a $CO_2$ gas source or a $NH_3$ gas source; and the fluid source 106 is a purge gas source, for example, an inert gas source, such as an argon gas or nitrogen gas source.

The fluid source 102 is in fluid communication with the boiler 130 via a conduit 108. A valve 110 is disposed on the conduit 108 between the fluid source 102 and the boiler 130 to control fluid flow between the fluid source 102 and the boiler 130. The fluid source 104 is in fluid communication with the boiler 130 via a conduit 112. A valve 116 is disposed on the conduit 112 between the fluid source 104 and the boiler 130 to control fluid flow between the fluid source 104 and the boiler 130. A check valve 114, such as a unidirectional flow valve, is also disposed on the conduit 112 between the valve 116 and the fluid source 104 to prevent backflow of fluid from the boiler to the fluid source 104.

In operation, the boiler 130 receives fluid from one or both of the fluid sources 102, 104 and heats and/or pressurizes the process fluids to form vapors and/or supercritical fluids. The fluid is flowed from the boiler 130 through a conduit 124 to a conduit 128 which is in fluid communication with the process chamber 132. A valve 126 is disposed on the conduit 124 between the conduit 128 and the boiler 130 to control fluid flow between the boiler 130 and the process chamber 132.

The fluid source 106 is in fluid communication with the process chamber 132 via a conduit 118 and the conduit 128 which is coupled to the process chamber. A valve 122 is disposed on the conduit 118 between the fluid source 106 and the conduit 128 to control fluid flow between the fluid source 106 and the process chamber 132. A check valve 120, such as a unidirectional flow valve, is also disposed on the conduit 118 between the valve 122 and the fluid source 106 to prevent backflow of fluid between the process chamber 132 and the fluid source 106.

A portion of each of the conduits 108, 112, 118 disposed downstream from the valves 110, 116, 122, respectively, are condensation controlled. For example, those portions are jacketed and heated to prevent condensation of fluid flowing through the portions. Alternatively, those portions are p-trapped to collect condensation from fluid flowing through the portions. Conduits 124, 128 are also condensation controlled. Similar to the conduits 108, 112, 118, the conduits 124, 128 may be jacketed and heated and/or p-trapped to substantially prevent or collect condensation of fluid flowing through the conduits 124, 128.

The process chamber 132 is configured as a high pressure/high temperature vessel capable of operating at pressures utilized to maintain vapors and/or supercritical fluids for substrate processing. In one embodiment, the process chamber 132 is a single substrate process chamber. In another embodiment, the process chamber 132 is a batch process chamber for processing multiple substrates at one time. The process chamber 132 may also be configured for performing various substrate processing operations, such as substrate cleaning or the like. In one example, the process chamber 132 is configured for performing a supercritical substrate cleaning process.

Disposed in the downstream region 180 from the process chamber 132, the condenser 150 is in fluid communication with the process chamber 132. A conduit 134 extends from the process chamber 132 to a heat exchanger 140. A valve 136 is disposed on the conduit 134 between the process chamber 132 and the heat exchanger 140 to control fluid flow between the process chamber 132 and the heat exchanger 140. A check valve 138, such as a unidirectional valve, is disposed on the conduit 134 between the valve 136 and the heat exchanger 140 to prevent backflow of fluid from the heat exchanger 140 into the process chamber 132.

The heat exchanger 140 is utilized to cool fluid flowing from the process chamber 132. Fluids cooled by the heat exchanger 140 flow through a conduit 144 to the condenser 150. A heat exchanger 152 is also in fluid communication with the heat exchanger 140 via a conduit 142 which is coupled to the conduit 144. The conduit 142 is coupled to the conduit 144 between the condenser 150 and the heat exchanger 140.

A valve 148, such as a throttle valve or the like, is disposed on the conduit 144 between the condenser 150 and the conduit 142 to control fluid flowing to the condenser 150 from the heat exchanger 140. A valve 146 is disposed on the conduit 142 between the conduit 144 and the heat exchanger 152. When the valve 148 is closed and the valve 146 is opened, fluid flows from the heat exchanger 140 to the heat exchanger 152. A fluid flow path incorporating the heat exchanger 152 is utilized for further cooling and pressurization of gases exiting the heat exchanger 140.

A conduit 154 extends from the heat exchanger 152 to an exhaust 156. Cooled gases at pressures reduced from those utilized in the process chamber 132 are diverted prior to reaching the condenser 150. The exhaust 156 removes the gases from the system 100, for example, by delivering the gases to a facility exhaust.

The conduit 134 is condensation controlled. In one embodiment, the conduit 134 is jacketed and heated to prevent condensation of fluid flowing from the process chamber 132 to the heat exchanger 140. Alternatively, the conduit 134 is p-trapped to collect condensation from fluid flowing from the process chamber 132 to the heat exchanger 140. Similar to the conduit 134, the conduit 142 is also condensation controlled. A portion of the conduit 144 between the heat exchanger 140 and the valve 148 is similarly condensation controlled. By condensation controlling the aforementioned conduits 134, 142, 144 premature condensation of fluid flowing from the process chamber 132 to the condenser 150 is avoided or substantially reduced.

The condenser 150 is a temperature and pressure controlled vessel which condenses fluid received from the process chamber 132 to make collection of the fluid as a liquid more efficient. By condensing the fluid to a liquid, the fluid may be filtered and reutilized in subsequent substrate processing operations. In one embodiment, the condenser 150 includes physical features for increasing the surface area of material exposed to the fluid in the condenser 150. In one example, a porous scaffolding or porous filter is disposed within the condenser to increase the surface area over which the fluid flows within the condenser 150. For example, the porous scaffolding or porous filter is formed from a sintered metal material. In another embodiment, extended and/or tortured fluid flow pathways are disposed within the condenser 150 to further facilitate more efficient fluid condensation.

In one embodiment, the condenser 150 includes a heat sink to further cool fluid delivered to the condenser 150. The heat sink may be temperature controlled to encourage condensation of the fluid on the heat sink. In one embodiment, the heat sink is finned to increase the surface area within the condenser 150 to facilitate condensation. In various embodiments, the structures of the condenser 150 and the heat sink are temperature controlled to be below the condensation temperature of the fluid to be condensed within the condenser 150. It is also contemplated that as condensation progresses, pressure within the condenser 150 drops which may be utilized to facilitate flow of the condensed fluid from the condenser 150.

A level sensor 164 is operably coupled to the condenser 150. The level sensor 164, such as a float or the like, determines an amount of condensed fluid within the condenser 150. In one embodiment, data derived from the level sensor 164 regarding the amount of fluid in the condenser 150 is utilized to operate a valve 160 which controls fluid flow from the condenser 150 via a conduit 158 to a fluid collection unit 166. The fluid collection unit 166 collects condensed fluid form the condenser 150 and may optionally filter the fluid to prepare the fluid for reuse. A heat exchanger 162 is also disposed on the conduit 158 between the fluid collection unit 166 and the valve 160 to further cool the condensed fluid prior to delivering the fluid to the fluid collection unit 166.

In operation, a fluid is heated and/or pressurized in the boiler 130 and delivered to the process chamber 132 to process a substrate disposed therein. After processing of the substrate, the fluid is delivered to the condenser 150 to condense and collect the condensed fluid in a fluid collection unit 166. Various examples of fluid processing regimes utilizing the apparatus 100 are described in detail below.

Pressure within the system 100 is controlled by a temperature of the boiler 130. In this embodiment, valve 136 is closed and valve 126, which may be a throttle valve, is opened. A temperature of the boiler 130 is set such that a pressure of the boiler 130 is greater than a temperature of the process chamber 132. In this embodiment, valve 126 functions as a pressure regulator and valve 136 functions as a pressure bleed from the process chamber 132 if a pressure of the process chamber 132 is above a predetermined threshold. In another embodiment, valve 126 functions as a flow limiting valve and valve 136 functions as a back pressure regulator to facilitate pressure control within the process chamber 132. The embodiments, described above may be implemented with or without active flow of fluid through the system, depending upon the desired implementation.

In one embodiment, water is utilized to form a process fluid. In operation, the process chamber 132 is opened by closing valve 126 and opening valve 136 and valve 160. The condensation controlled conduits described above are heated to a temperature of between about 275° C. and about 300° C. The boiler 130 is pressurized to about 50 bar and heated to a temperature suitable to facilitate formation of water vapor. A substrate is positioned in the process chamber 132, the process chamber 132 is closed, and the process chamber 132 purged by opening valve 122 to deliver purge gas from the fluid source 106. After purging, valve 122 is closed.

The process chamber 132 is heated to a temperature of between about 450° C. and about 500° C. and valve 136 and valve 160 are closed prior to, during, or after heating of the process chamber 132. Valve 126 is opened to pressurize the process chamber 132 by delivery of the process fluid. As a result, the pressure and temperature of the boiler 130 will be reduced. Valve 126 is then closed while the boiler 130 recovers and valve 126 is reopened when the pressure of the boiler 130 is about equal to the pressure of the process chamber 132.

Valve 126 is closed when the pressure within the process chamber 132 is between about 40 bar and about 50 bar. The substrate is processed for a predetermined amount of time and then valve 136 is opened to depressurize the process chamber 132. The process fluid is condensed in the condenser 150 which is maintained at a temperature of between about 50° C. and about 80° C. and a pressure of about 1 ATM. When the pressure within the process chamber 132 has stabilized, valve 160 is opened and the condensed fluid is delivered to the fluid collection unit 166. When the process chamber 132 has cooled, the processed substrate is then removed.

In another embodiment, $CO_2$ is utilized to form a process fluid. In operation, the process chamber 132 is "opened" by closing valve 126 and opening valve 136 and valve 160. The condensation controlled conduits described above are heated to a temperature of between about 30° C. and about 100° C. The condenser 150 is controlled at a temperature of between about 8° C. and about 10° C. The boiler 130 is heated to a temperature of about 100° C. and maintained at a pressure suitable to facilitate formation of supercritical $CO_2$. A substrate is positioned in the process chamber 132, the process chamber 132 is closed, and the process chamber 132 purged by opening valve 122 to deliver purge gas from the fluid source 106. After purging, valve 122 is closed.

The process chamber 132 is pressurized to about 80 bar, heated to a temperature of about 100° C., and valve 136 and valve 160 are closed. Valve 126 is opened to pressurize the process chamber 132 by delivery of the process fluid. As a result, the pressure and temperature of the boiler 130 will be reduced. Valve 126 is then closed while the boiler 130 recovers and valve 126 is reopened when the pressure of the boiler 130 is about equal to the pressure of the process chamber 132.

Valve 126 is closed when the pressure within the process chamber 132 is between about 80 bar and about 100 bar. The substrate is processed for a predetermined amount of time and then valve 136 is opened to depressurize the process chamber 132. The heat exchanger 140 reduces the temperature of fluid flowing from the process chamber 132 from a temperature of about 100° C. to a temperature of about 50° C. The process fluid is condensed in the condenser 150 which is maintained at a temperature of between about 8° C. and about 10° C. and a pressure of about 45 bar. When the pressure within the process chamber 132 has stabilized, valve 160 is opened and the condensed fluid is delivered to the fluid collection unit 166. One or both of conduits 142 and 154 are opened to remove gas and further depressurize the system 100. When the process chamber 132 has cooled, the processed substrate is then removed.

In another embodiment, $NH_3$ is utilized to form a process fluid. In operation, the process chamber 132 is "opened" by closing valve 126 and opening valve 136 and valve 160. The condensation controlled conduits described above are heated to a temperature of about 50° C. The condenser 150 is controlled at a temperature of −20° C. The boiler 130 is heated to a temperature of about 45° C. and maintained at a pressure suitable to facilitate formation of supercritical $NH_3$. A substrate is positioned in the process chamber 132, the process chamber 132 is closed, and the process chamber 132 purged by opening valve 122 to deliver purge gas from the fluid source 106. After purging, valve 122 is closed.

The process chamber 132 is pressurized to about 10 bar, heated to a temperature of about 500° C., and valve 136 and valve 160 are closed. Valve 126 is opened to pressurize the process chamber 132 by delivery of the process fluid. As a result, the pressure and temperature of the boiler 130 will be reduced. Valve 126 is then closed while the boiler 130 recovers and valve 126 is reopened when the pressure of the boiler 130 is about equal to the pressure of the process chamber 132.

Valve 126 is closed when the pressure within the process chamber 132 is between about 10 bar. The substrate is processed for a predetermined amount of time and then valve 136 is opened to depressurize the process chamber 132. The heat exchanger 140 reduces the temperature of fluid flowing from the process chamber 132 from a temperature of about 500° C. to a temperature of about 50° C. The process fluid is condensed in the condenser 150 which is maintained at a temperature of about −20° C. and a pressure of about 2 bar. When the pressure within the process chamber 132 has stabilized, valve 160 is opened and the condensed fluid is delivered to the fluid collection unit

166. One or both of conduits 142 and 154 are opened to remove gas and further depressurize the system 100. When the process chamber 132 has cooled, the processed substrate is then removed.

While the foregoing is directed to embodiments of the present disclosure, other and further embodiments of the disclosure may be devised without departing from the basic scope thereof, and the scope thereof is determined by the claims that follow.

What is claimed is:

1. A substrate process method, comprising:
   heating a boiler in fluid communication with a process chamber, a condenser, and a fluid collection unit;
   closing a boiler valve disposed on a conduit connecting the boiler and the process chamber;
   opening valves disposed on conduits connecting the fluid collection unit and the process chamber;
   positioning a substrate in the process chamber;
   heating the process chamber;
   closing the valves disposed on conduits connecting the fluid collection unit and the process chamber;
   opening the boiler valve to enable fluid flow between the boiler and the process chamber;
   flowing a heated fluid from the boiler to the process chamber;
   processing the substrate with the heated fluid; opening valves disposed on conduits connecting the condenser and the process chamber process to enable fluid flow between the process chamber and the condenser; and
   depressurizing the process chamber by flowing the heated fluid from the process chamber to the condenser.

2. The method of claim 1, wherein the conduits connecting the fluid collection unit and the process chamber, and conduits connecting an exhaust and the process chamber, are heated.

3. The method of claim 1, wherein conduits connecting a fluid source and the process chamber are heated.

4. The method of claim 1, wherein the boiler is in fluid communication with a water source.

5. The method of claim 4, further comprising:
   heating conduits connecting the fluid collection unit and the condenser to a temperature of between about 30° C. and about 100° C.

6. The method of claim 1, wherein the boiler is in fluid communication with an $NH_3$ source.

7. The method of claim 1, further comprising:
   detecting an amount of condensed fluid in the condenser;
   determining when the amount of condensed fluid is above a predetermined threshold; and
   delivering the condensed fluid to the fluid collection unit.

8. The method of claim 4, wherein the fluid is water vapor.

9. The method of claim 4, further comprising:
   heating conduits connecting the fluid collection unit and the condenser to a temperature of between about 275° C. and about 300° C.

10. The method of claim 4, wherein the process chamber is heated to a temperature of between about 450° C. and about 500° C.

11. The method of claim 5, wherein the fluid is supercritical $CO_2$.

12. The method of claim 5, further comprising:
    heating conduits connecting the process chamber to fluid sources, the conduits connecting the process chamber and the condenser, and conduits connecting the process chamber to heat exchangers, to a temperature of between about 30° C. and about 100° C.; and
    pressurizing the boiler.

13. The method of claim 5, further comprising:
    pressurizing the process chamber to between about 80 bar and about 100 bar; and
    heating the process chamber to about 100° C.

14. The method of claim 5, wherein opening valves disposed on conduits connecting the process chamber to a heat exchanger reduces a temperature of the fluid.

15. The method of claim 5, wherein the condenser is maintained at a temperature of between about 8° C. and about 10° C.

16. The method of claim 6, wherein the fluid is supercritical $NH_3$.

17. The method of claim 9, wherein the process chamber is pressurized to between about 40 bar and about 50 bar.

* * * * *